United States Patent
Urushima

(10) Patent No.: US 6,173,884 B1
(45) Date of Patent: Jan. 16, 2001

(54) SEMICONDUCTOR DEVICE AND EQUIPMENT FOR MANUFACTURING THE SAME AS WELL AS METHOD OF FABRICATING THE SAME

(75) Inventor: Michitaka Urushima, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/238,426

(22) Filed: Jan. 28, 1999

(30) Foreign Application Priority Data

Jan. 28, 1998 (JP) .................................................. 10-015462

(51) Int. Cl.⁷ ........................... B23K 31/00; B23K 31/02; B23K 37/00
(52) U.S. Cl. ....................... 228/180.5; 228/4.5; 228/44.7; 228/180.21
(58) Field of Search ............................ 228/180.21, 180.5, 228/44.7, 4.5

(56) References Cited

U.S. PATENT DOCUMENTS

| | | | |
|---|---|---|---|
| 5,390,844 | * 2/1995 | Distefano et al. | 228/180.21 |
| 5,660,318 | 8/1997 | Jung et al. | |
| 5,686,352 | * 11/1997 | Higgins, III | 437/182 |
| 5,743,459 | * 4/1998 | Urushima | 228/180.21 |
| 5,929,517 | * 7/1999 | Distefano et al. | 257/707 |
| 5,935,542 | * 8/1999 | Nakamura et al. | 228/44.7 |
| 6,006,981 | * 12/1999 | Madrid | 228/180.5 |
| 6,011,315 | * 1/2000 | Toyosawa et al. | 257/783 |

FOREIGN PATENT DOCUMENTS 3-209736  9/1991  (JP).
9-129809  5/1997  (JP).

* cited by examiner

Primary Examiner—Patrick Ryan
Assistant Examiner—Zidia T. Pittman
(74) Attorney, Agent, or Firm—Young & Thompson

(57) ABSTRACT

A bonding tool for bonding an inner lead to an electrode pad of a semiconductor chip, wherein the bonding tool has a head surface which is rectangular. The rectangular head surface has a long side that is perpendicular to a longitudinal direction of the inner lead and wider than a width of the inner lead, and a short side that is narrower than an opening in a passivation film.

7 Claims, 15 Drawing Sheets

SEMICONDUCTOR DEVICE AND EQUIPMENT FOR MANUFACTURING THE SAME AS WELL AS METHOD OF FABRICATING THE SAME

BACKGROUND OF THE INVENTION

The present invention relates to a semiconductor device and a method of forming the same, and more particularly to a semiconductor device formed by bonding inner leads of a tape automated bonding tape or a lead frame onto electrode pads of a semiconductor chip, and a method of forming the same.

FIG. 1A is a fragmentary plan view illustrative of a film carrier tape to be used for a tape automated bonding process for packaging a semiconductor device. FIG. 1B is a fragmentary cross sectional elevation view illustrative of the film carrier tape of FIG. 1A. A polyimide base film 6 has two side regions, each of which has an alignment of sprocket holes 7 for carrying and positioning the polyimide base film 6. A longitudinal center region of the polyimide base film 6 has a square device hole 10 for allowing a semiconductor chip 3 to enter into the device hole 10. A metal foil such as a copper foil is formed on a surface of the polyimide base film 6 before a photo-lithography is carried out to pattern the metal foil thereby to form leads 2 and test pads 11. Each of the leads 2 comprises an inner lead 2A projecting over the device hole 10 and an outer lead 2B connected with the inner lead and positioned outside the device hole 10. A metal film such as gold, tin or solder is plated on the foil. Outer lead holes 9 are formed in the base film 6 so that the outer lead holes 9 are positioned under the outer leads 2B and outside the device hole 10 but inside the test pads 11. A suspender 8 is formed for suspending the leads 2 and is positioned between the outer lead holes 9 and the device hole 10.

For bonding the inner leads 2A to the semiconductor chip 3, bumps 12 have previously been provided so that the inner leads 2A are pressed onto the bumps 12 while heating the same for compression bonding or eutectic bonding to bond the metal plating of the inner leads 2A onto the bumps 12. This bonding process is known as inner lead bonding.

It has been proposed to carry out the inner lead bonding without, however, using the bumps. FIG. 2A is a fragmentary cross sectional elevation view illustrative of a conventional bump-free inner lead bonding process for bonding metal platings of the inner leads onto electrode pads of a semiconductor chip. FIG. 2B is a fragmentary cross sectional elevation view illustrative of another conventional bump-free inner lead bonding process for bonding metal platings of the inner leads onto electrode pads of a semiconductor chip. The inner lead 2 remains directly in contact with a passivation film 4 formed around a pad 5 until a bonding tool 1 presses the inner lead 2 downwardly for direct bonding of the inner lead 2 onto the pad 5.

In Japanese laid-open patent publication No. 2-119153, the bumpfree inner lead bonding is disclosed, wherein the inner lead is directly bonded onto the pad without using the bump. This publication is silent on passivation film. Considering the passivation film, the bonding tool 1 of FIG. 2A may comprise the left one of two bonding tools illustrated in FIG. 3. FIG. 3 is a view illustrative of two types of available bonding tools for inner lead bonding processes. The left one of the two types of available bonding tools in FIG. 3 has a square head portion larger than a pad opening portion. An ultrasonic wave oscillation is applied in a direction along the longitudinal direction of the inner lead for the inner lead bonding process.

In Japanese patent No. 2500725, the bump free inner lead bonding method is disclosed, which is also illustrated in FIG. 2B. The bonding tool 1 of FIG. 2B may comprise the right one of the two bonding tools illustrated in FIG. 3. The right one of the two types of available bonding tools in FIG. 3 has a cross-shaped head portion smaller than an pad opening portion of the passivation film for forming a cross-shaped depressed portion on the inner lead 2 with an ultrasonic wave oscillation.

The bump free inner lead bonding process is disadvantages in that the inner lead directly contacts the passivation film whereby the passivation film prevents the inner lead from pressing to the pad for a secure bonding. Even if the pressing force or pressure of the bonding tool is increased, a crack may appear on the passivation film or disconnection of the inner lead may appear at the corner of the head of the bonding tool.

If no passivation film is provided, then an ultrasonic wave thermocompression bonding is available for the inner lead bonding with the bumps. If, however, the passivation film is provided, then the ultrasonic wave thermocompression bonding is unavailable. The above Japanese publication describes that it is preferable that the lead is bent from a height of $\frac{1}{1000}$ to $\frac{7}{1000}$ of one inch. However, if the width of the bonding tool head is narrower than the width of the inner lead, then the lead is displaced not to be bonded onto the pad. Thus, a wider bonding tool head is required. In this case, however, the presence of the passivation film cause that the bonding tool head is positioned over the passivation film in the longitudinal direction of the inner lead, whereby it is difficult to carry out the inner lead bonding. The above conventional inner lead bonding method disclosed in the above Japanese publication is inapplicable when the passivation film is provided. The inner lead that is parallel to the direction of the ultrasonic wave oscillation can be pressed by the bonding tool head. The inner lead perpendicular to the direction of the ultrasonic wave oscillation cannot be pressed by the bonding tool head. Bonding is difficult because this inner lead may be displaced by the ultrasonic wave oscillation, or energy of the ultrasonic wave oscillation is hard to transfer into the inner lead. Whereas it may be proposed to rotate the semiconductor chip during the inner lead bonding process or rotate a horn for holding the bonding tool, the tape automated bonding process does not allow rotating the semiconductor chip or the horn.

In order to have settled the above problems, it was proposed to use a circle-symmetric bonding tool having a smaller head than the pad opening portion of the passivation film, so as to form a ridge-projecting portion for the inner lead bonding. Since the head of the bonding tool is smaller than the pad opening portion of the passivation film and further the circle-symmetric formation allows the inner lead to be displaced in the bonding process. If the ultrasonic wave is applied, then the inner lead is forced out. If the inner lead width is 50 micrometers or more, then the bonding is possible. If the bonding tool with the smaller head than the pad opening portion of the passivation film is used, then it is impossible to carry out the bonding at a narrow pitch. If the bonding is carried out at a narrow pitch of 80 micrometers and a pad opening diameter is 65 micrometers as well as an inner lead width of 40 micrometers, then the maximum width of the bonding tool head is 65 micrometers. In this case, since the accuracy of the bonder is ±10 micrometers, the bonding tool head may hit to the passivation film. If the bonding tool head width is 55 micrometers, then a displacement of not less than 7.5 micrometers of the inner lead from the bonding tool center results in an incomplete pressing by the bonding tool head onto the inner lead, whereby the application of the ultrasonic wave allows the inner lead displacement for making the inner lead bonding difficult. Tolerance of ±10 micrometers is actually present in the inner lead width, for which reason the inner lead bonding is difficult. In addition, a contact portion of the inner lead is the ridge-projecting portion, for which reason the bonding strength is insufficient. If, in order to prevent the displacement, the inner lead width is increased beyond the opening size of the passivation film, then the bonding tool head is restricted to deteriorate the transfer coefficient of the ultrasonic wave, thereby making the inner lead bonding difficult.

The above two conventional methods separately and individually bond each inner lead, whereby productivity is low.

Concurrent bonding to plural inner leads is disclosed in Japanese laid-open patent publication No. 8-172113. The bonding tool has a head having a plurality of rejecting portions in correspondence in position to the pad pitch. However, this method is also engaged with the above problem with displacement independently from the presence of the bumps.

In the above circumstances, it had been required to develop a novel bonding tool and a bonding method free from the above problems and disadvantages.

SUMMARY OF THE INVENTION

Accordingly, it is an object of the present invention to provide a novel inner lead bonding method free from the above problems.

It is a further object of the present invention to provide a novel inner lead bonding method applicable to a narrow pitch bonding of not larger than 80 micrometers.

It is a still further object of the present invention to provide a novel bonding tool free from the above problems.

It is yet a further object of the present invention to provide a novel bonding tool available for an inner lead bonding at a narrow pitch bonding of not larger than 80 micrometers.

The present invention provides a bonding tool to be used for an inner lead bonding process, wherein the bonding tool has a head surface which is rectangular.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
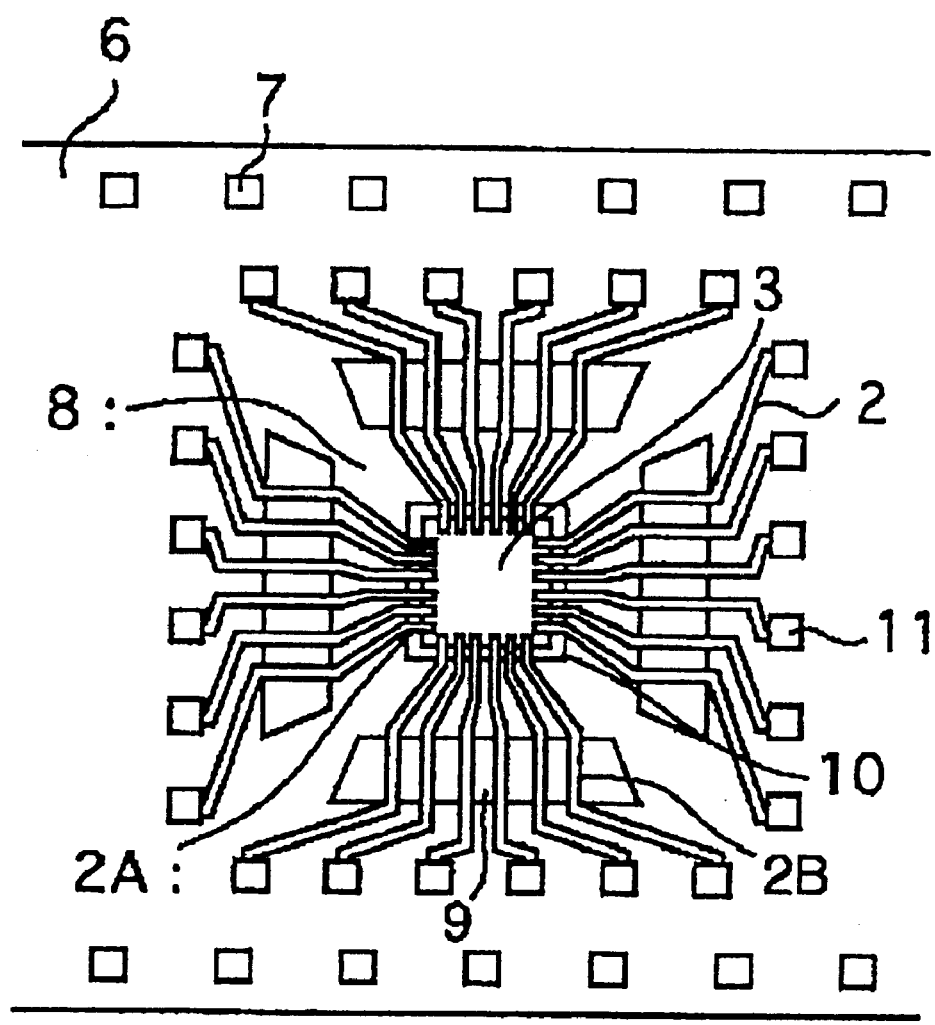
FIG. 1A is a fragmentary plan view illustrative of a film carrier tape to be used for a tape automated bonding process for packaging a semiconductor device.
Figure 1B:
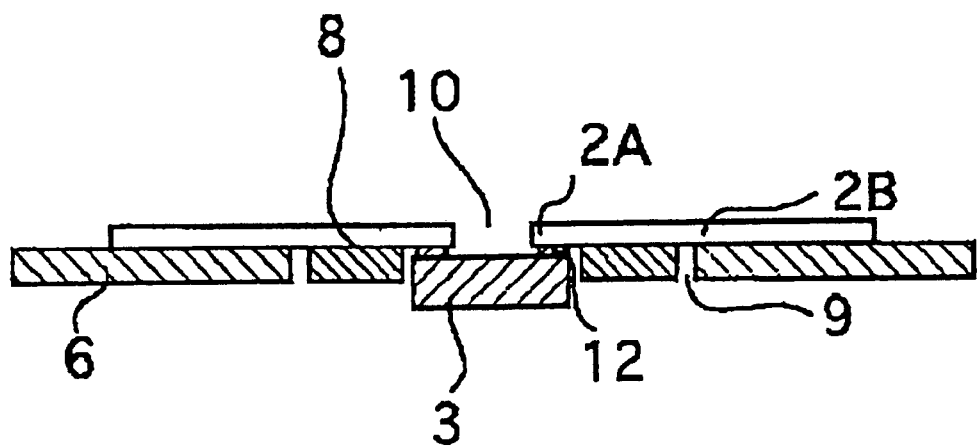
FIG. 1B is a fragmentary cross sectional elevation view illustrative of the film carrier tape of FIG. 1A.
Figure 2A:
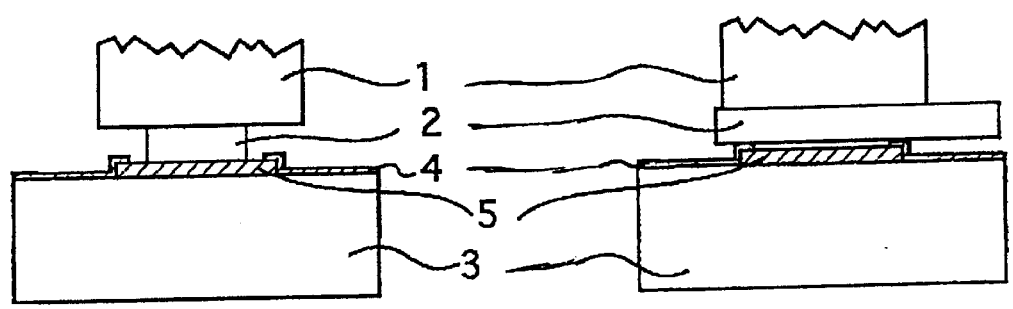
FIG. 2A is a fragmentary cross sectional elevation view illustrative of a conventional bump-free inner lead bonding process for bonding metal platings of the inner leads onto electrode pads of a semiconductor chip.
Figure 2B:
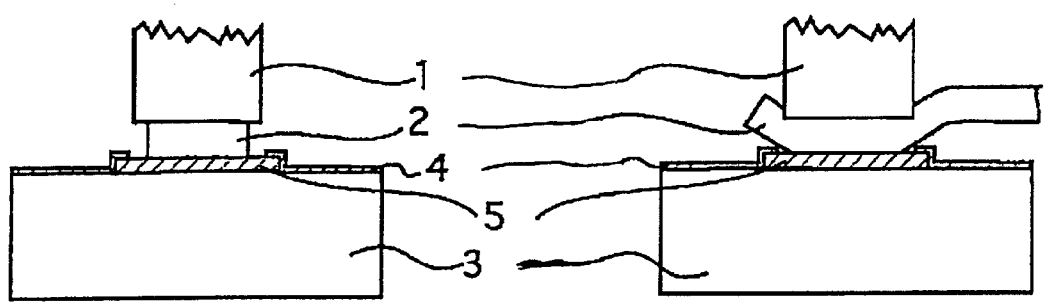
FIG. 2B is a fragmentary cross sectional elevation view illustrative of another conventional bump-free inner lead bonding process for bonding metal platings of the inner leads onto electrode pads of a semiconductor chip.
Figure 3:
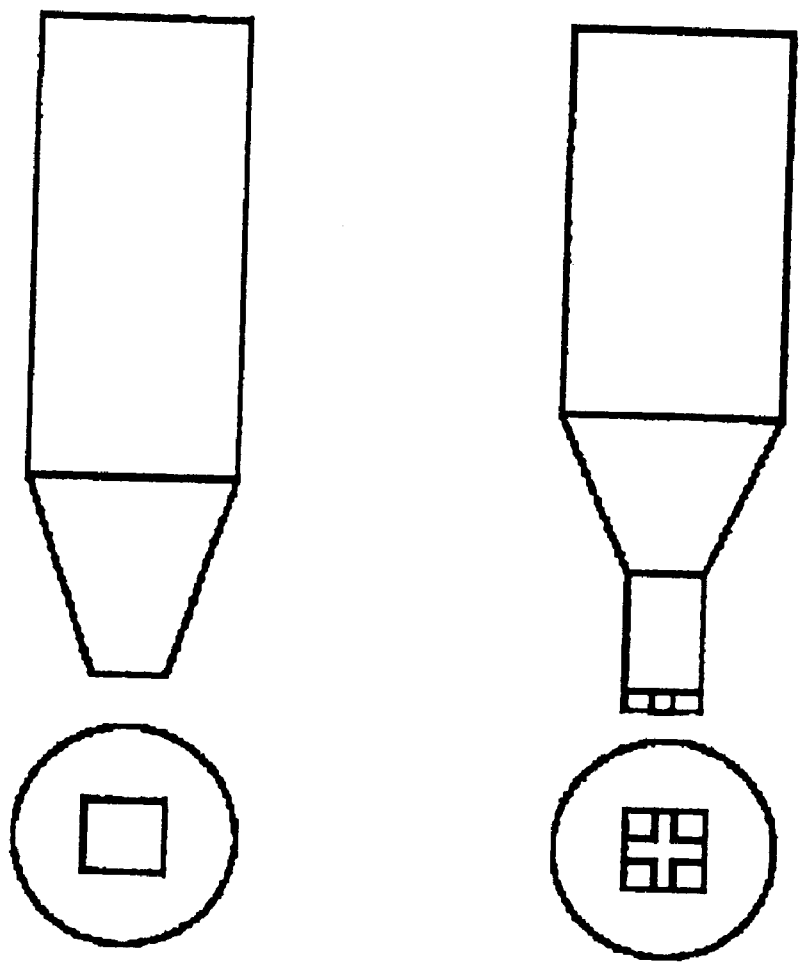
FIG. 3 is a view illustrative of two types of available bonding tools for inner lead bonding processes.

The first aspect of the present invention provides a bonding tool to be used for an inner lead bonding process, wherein the bonding tool has a head surface which is rectangular.

It is preferable that the bonding tool is set so that a long side of the head surface is parallel to a longitudinal direction of an inner lead whilst a short side of the head surface is perpendicular to the longitudinal direction of the inner lead.

It is also preferable that the head of the bonding tool is corner-chamfered.

It is also preferable that the head of the bonding tool is corner-rounded.

The second aspect of the present invention provides an elastic cover film covering a passivation film for protecting the passivation film from a damage by a bonding tool in an inner lead bonding process, and the elastic cover film having an opening which is substantially the same size as an opening of the passivation film.

It is preferable that opening side walls facing to the opening are sloped.

The third aspect of the present invention provides an electrode pad to be bonded with an inner lead by a inner lead bonding process by a bonding tool, wherein the electrode pad is rectangular to have a long side parallel to a longitudinal direction of the inner lead and a short side perpendicular to the longitudinal direction of the inner lead.

It is preferable that the long side of the rectangular electrode pad is not smaller than a sum of a pitch of adjacent two of the inner leads and a width of the inner lead.

The fourth aspect of the present invention provides a bonding tool to be used for an inner lead bonding process for concurrently bonding at least two inner leads onto at least two electrode pads, wherein the bonding tool has a head surface which is square to have four uniform sides, each of which is not smaller than a sum of a pitch of adjacent two of the inner leads and a width of the inner lead.

The fifth aspect of the present invention provides an inner lead bonding process for bonding an inner lead onto an electrode pad by use of a bonding tool, wherein the bonding tool has a head surface which is rectangular.

It is preferable that the bonding tool is set so that a long side of the head surface is parallel to a longitudinal direction of an inner lead whilst a short side of the head surface is perpendicular to the longitudinal direction of the inner lead.

It is also preferable that the head of the bonding tool is corner-chamfered.

It is also preferable that the head of the bonding tool is corner-rounded.

The sixth aspect of the present invention provides an inner lead bonding process for bonding an inner lead onto an electrode pad by use of a bonding tool having a head surface which is rectangular, wherein the inner lead bonding process is carried out after an elastic cover film has been provided to cover a passivation film for protecting the passivation film from a damage by the bonding tool, and the elastic cover film has an opening which is substantially the same size as an opening of the passivation film.

It is preferable that opening side walls facing to the opening are sloped.

The seventh aspect of the present invention provides an inner lead bonding process for concurrently bonding at least two inner leads onto electrode pads, each of which is rectangular to have a long side parallel to a longitudinal direction of the inner lead and a short side perpendicular to the longitudinal direction of the inner lead by use of a single bonding tool having a head surface which is square to have four uniform sides, each of which is not smaller than a sum of a pitch of adjacent two of the inner leads and a width of the inner lead.

It is preferable that the long side of the rectangular electrode pad is not smaller than a sum of a pitch of adjacent two of the inner leads and a width of the inner lead.

PREFERRED EMBODIMENTS

Figure 4:
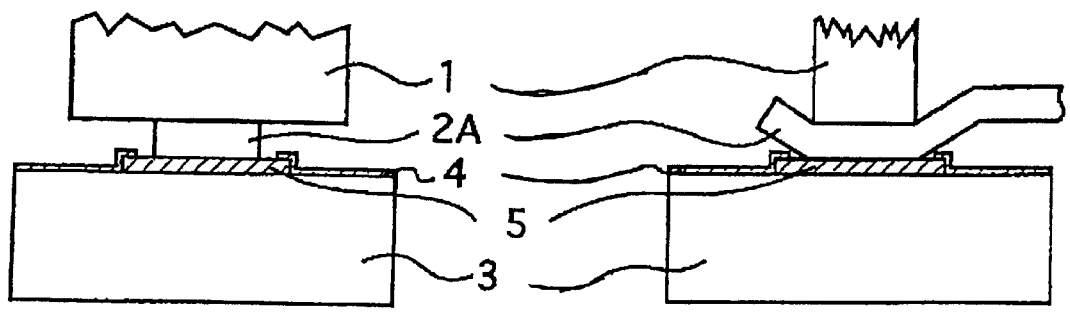
FIG. 4 is a fragmentary cross sectional elevation view illustrative of a first novel bump-free inner lead bonding process for bonding an inner lead onto an electrode pad of a semiconductor chip by use of a novel bonding tool in a first embodiment in accordance with the present invention.

A first embodiment according to the present invention will be described in detail with reference to FIG. 4 in which a gold-plated inner lead 2A is placed over a pad 5 on a semiconductor chip 3. A passivation film 4 is provided to cover a top surface of the semiconductor chip 3 around the pad 5. The pad 5 is heated to about 250–350° C. before the gold-plated inner lead 2A is placed over the heated pad 5. The novel bonding tool 1 is operated to press the gold-plated inner lead 2A onto the pad 5. The above novel bonding tool 1 has a rectangular shaped head which has a long side perpendicular to a longitudinal direction of the inner lead 2A and a short side parallel to the longitudinal direction of the inner lead 2A, wherein the long side is much wider than the width of the inner lead 2A for completely pressing the inner lead 2A whilst the short side is shorter than a size of the opening of the passivation film 4 for making the inner lead 2A into securely contact with the pad 5 without, however, contact with the passivation film 4. Subsequently, an ultrasonic wave is applied to remove an oxide film from the contact portion. Thereafter, the application of the ultrasonic wave is discontinued whilst the down-force for pressing the inner lead 2A onto the pad 5 is increased to securely bond the inner lead 2A to the pad 5. The novel bonding tool is capable of securely bonding the inner lead 2A onto the pad 5 without displacement of the inner lead during the bonding process including the application of the ultrasonic wave, even if accuracy is slightly deteriorated in positioning of the inner lead 2A over the pad 5 before the bonding process. Since the short side of the bonding tool head is shorter than the size of the opening of the passivation film 4, the bonding tool head does not hit the passivation film 4 whereby no crack is caused nor incomplete bonding is caused. A bonding area of the inner lead 2A with the pad 5 is defined by the area of the bonding tool head, whereby the bonding strength is remarkably improved.

Figure 5A:
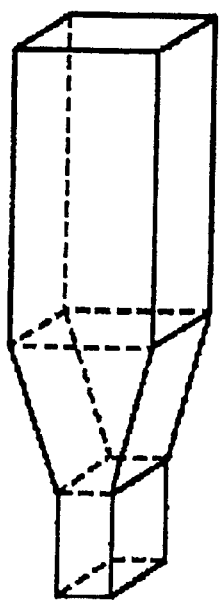
FIG. 5A is a perspective view illustrative of a novel bonding tool to be used for a novel first novel bump-free inner lead bonding process for bonding an inner lead onto an electrode pad of a semiconductor chip by use of a novel bonding tool in a first embodiment in accordance with the present invention.
Figure 5B:
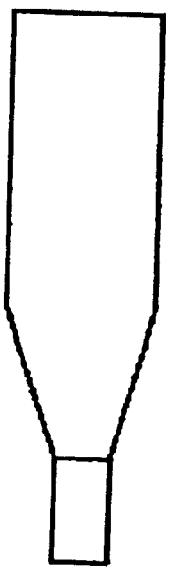
FIG. 5B is a front view illustrative of the novel bonding tool of FIG. 5A.
Figure 6A:
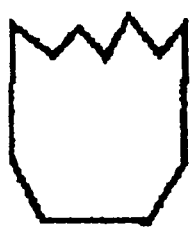
FIG. 6A is a fragmentary view illustrative of a corner-chamfered bonding tool head shape in a short side view of a novel bonding tool modified from the above novel bonding tool of FIGS. 5A and 5B.
Figure 6B:
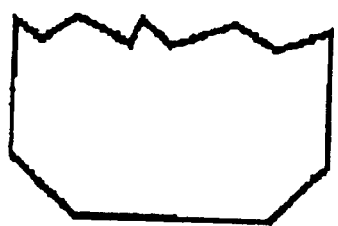
FIG. 6B is a fragmentary view illustrative of a corner-chamfered bonding tool head shape in a long side view of a novel bonding tool modified from the above novel bonding tool of FIGS. 5A and 5B.
Figure 6C:
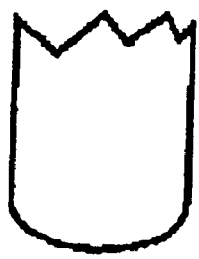
FIG. 6C is a fragmentary view illustrative of a corner-rounded bonding tool head shape in a short side view of a novel bonding tool modified from the above novel bonding tool of FIGS. 5A and 5B.
Figure 6D:
FIG. 6D is a fragmentary view illustrative of a corner-rounded bonding tool head shape in a long side view of a novel bonding tool modified from the above novel bonding tool of FIGS. 5A and 5B.

FIG. 6A is a fragmentary view illustrative of a comer-chamfered bonding tool head shape in a short side view of a novel bonding tool modified from the above novel bonding tool of FIGS. 5A and 5B, wherein the comers are C-chamfered at about 40–60 degrees. FIG. 6B is a fragmentary view illustrative of a comer-chamfered bonding tool head shape in a long side view of a novel bonding tool modified from the above novel bonding tool of FIGS. 5A and 5B, wherein the comers are C-chamfered at about 40–60 degrees. FIG. 6C is a fragmentary view illustrative of a corner-rounded bonding tool head shape in a short side view of a novel bonding tool modified from the above novel bonding tool of FIGS. 5A and 5B, wherein the comers are rounded at a radius of 50–200 micrometers. FIG. 6D is a fragmentary view illustrative of a corner-rounded bonding tool head shape in a long side view of a novel bonding tool modified from the above novel bonding tool of FIG. s SA and 5B, wherein the comers are rounded at a radius of 50–200 micrometers. The comer-chamfered or corner-rounded bonding tool head as illustrated in FIGS. 6A through 6D is preferable to reduce a damage to the inner lead 2A in bonding process. This reduces the depression of the bonding region of the inner lead 2A. For example, if the non-modified bonding tool had of FIGS. 5A and 5B is used, then the thickness of the bonding region of the inner lead 2A is reduced by the bonding process into about one half of the original thickness. By contrast, if the comer-chamfered or corner-rounded bonding tool head as illustrated in FIGS. 6A through 6D is used, then the thickness of the bonding region of the inner lead 2A is reduced by the bonding process into about two third of the original thickness. Namely, the use of the corner-chamfered or corner-rounded bonding tool head suppresses the thickness-reduction due to uniform deformation or depression. This also results in no reduction in strength of the inner lead, whereby it is possible to bond the inner leads at a narrower pitch.

Figure 7:
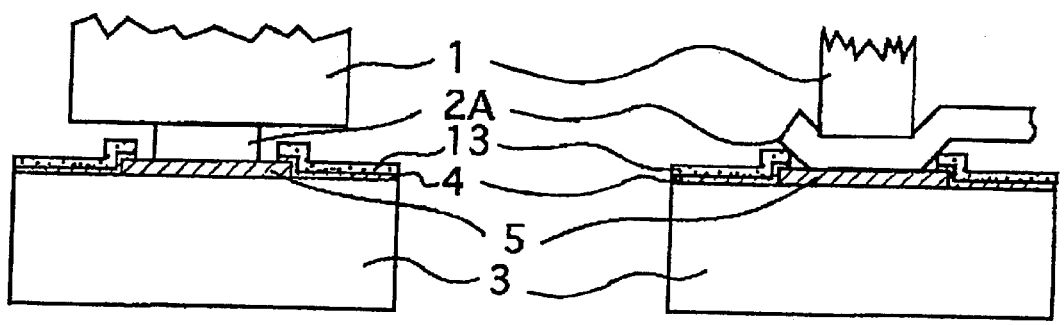
FIG. 7 is a fragmentary cross sectional elevation view illustrative of a second novel bump-free inner lead bonding process for bonding an inner lead onto an electrode pad of a semiconductor chip by use of a novel bonding tool in a second embodiment in accordance with the present invention.
Figure 8:
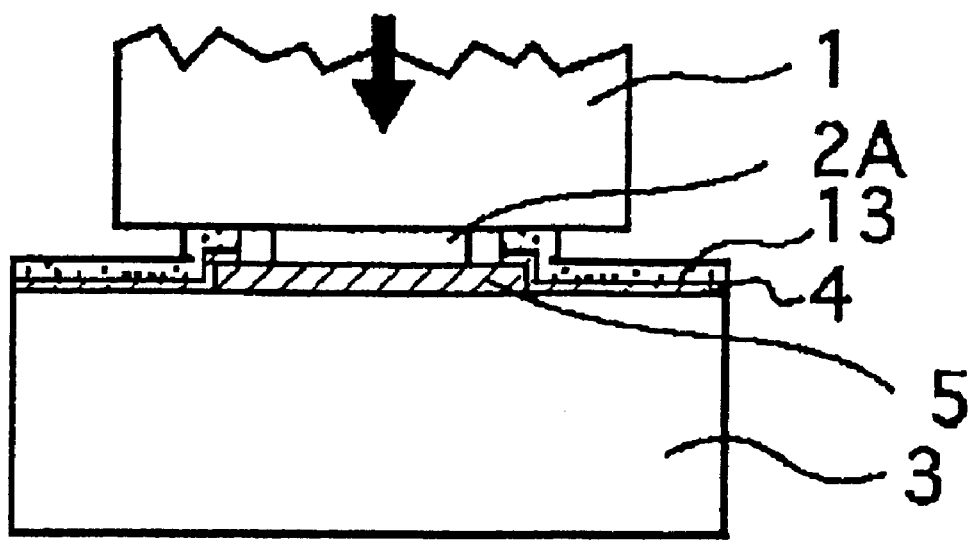
FIG. 8 is a fragmentary cross sectional elevation view illustrative of an inner lead bonded by a bonding tool head onto an electrode pad in a second novel bump-free inner lead bonding process in a second embodiment in accordance with the present invention.

A second embodiment according to the present invention will be described in detail with reference to FIG. 7 in which a gold-plated inner lead 2A is placed over a pad 5 on a semiconductor chip 3. A passivation film 4 is provided to cover a top surface of the semiconductor chip 3 around the pad 5. Further, an elastic cover film 13 is provided on the passivation film 4 for protecting the passivation film 4 from the bonding tool head even if the bonding tool head 1 hits the elastic cover film 13. This means it possible to further increase the bonding load or down force of the bonding tool for more secure bonding between the inner lead 2A and the pad 5.

Figure 9A:
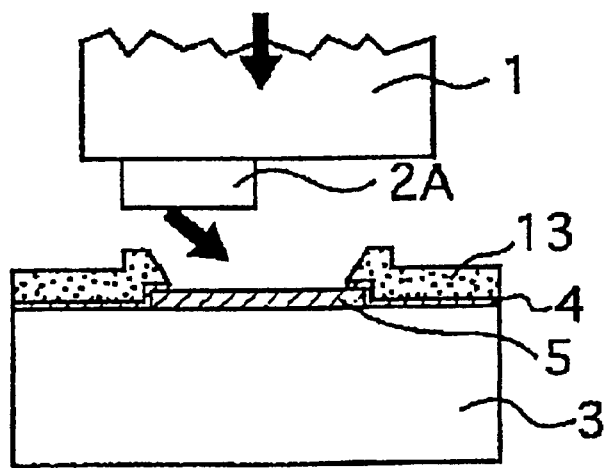
FIG. 9 is a fragmentary cross sectional elevation view illustrative of the second novel bump-free inner lead bonding process for bonding an inner lead onto an electrode pad of a semiconductor chip by use of a novel bonding tool when the inner lead is displaced.
Figure 9B:
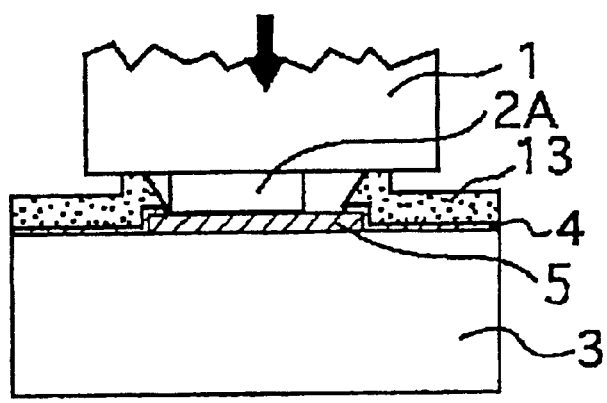

FIG. 9 is a fragmentary cross sectional elevation view illustrative of the second novel bump-free inner lead bonding process for bonding an inner lead onto an electrode pad of a semiconductor chip by use of a novel bonding tool when the inner lead is displaced. The elastic cover film 13 is provided around the pad 5 or between the pads 5, so that even if the inner lead 2A is displaced, then the wider bonding tool head 1 allows self-compensation to the displacement of the inner lead 2A during the press down onto the pad 5, whereby the inner lead 2A enters into the opening of the elastic cover film 13 and the passivation film 4 and thus the inner lead 2A is made into securely contact with the pad 5. It is also preferable that the tapered or sloped side walls facing the opening of the elastic cover film 13 promotes or facilitates the self-compensation to the displacement of the inner lead 2A.

The pad 5 is heated to about 250–350° C. before the gold-plated inner lead 2A is placed over the heated pad 5. The novel bonding tool 1 is operated to press the gold-plated inner lead 2A onto the pad 5. The above novel bonding tool 1 has a rectangular shaped head which has a long side perpendicular to a longitudinal direction of the inner lead 2A and a short side parallel to the longitudinal direction of the inner lead 2A, wherein the long side is much wider than the width of the inner lead 2A for completely pressing the inner lead 2A whilst the short side is shorter than a size of the opening of the passivation film 4 for making the inner lead 2A into securely contact with the pad 5 without, however, contact with the passivation film 4. Subsequently, an ultrasonic wave is applied to remove an oxide film from the contact portion. Thereafter, the application of the ultrasonic wave is discontinued whilst the down-force for pressing the inner lead 2A onto the pad 5 is increased to securely bond the inner lead 2A to the pad 5. The novel bonding tool is capable of securely bonding the inner lead 2A onto the pad 5 without displacement of the inner lead during the bonding process including the application of the ultrasonic wave, even if an accuracy is slightly deteriorated in positioning of the inner lead 2A over the pad 5 before the bonding process. Since the short side of the bonding tool head is shorter than the size of the opening of the passivation film 4, the bonding tool head noes not hit to the passivation film 4 whereby no crack is caused nor incomplete bonding is caused. A bonding area of the inner lead 2A with the pad 5 is defined by the area of the bonding tool head, whereby the bonding strength is remarkably improved.

A third embodiment according to the present invention will be described in detail with reference to FIG. 10.

Whereas the normal pad is square, in accordance with this embodiment, the pad is rectangular to have a longitudinal direction in parallel to the longitudinal direction of the inner leads.

Figure 10:
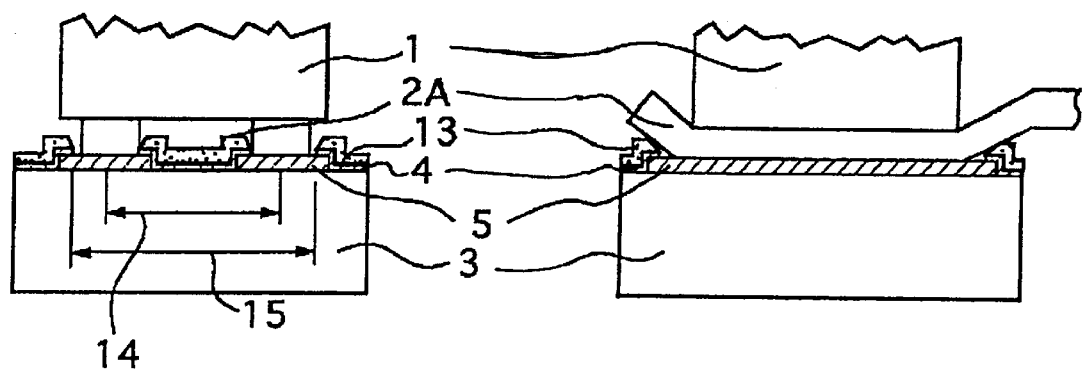
FIG. 10 is a fragmentary cross sectional elevation view illustrative of a third novel bump-free inner lead bonding process for concurrently bonding plural inner leads onto electrode pads of a semiconductor chip by use of a novel bonding tool in a third embodiment in accordance with the present invention.
Figure 11A:
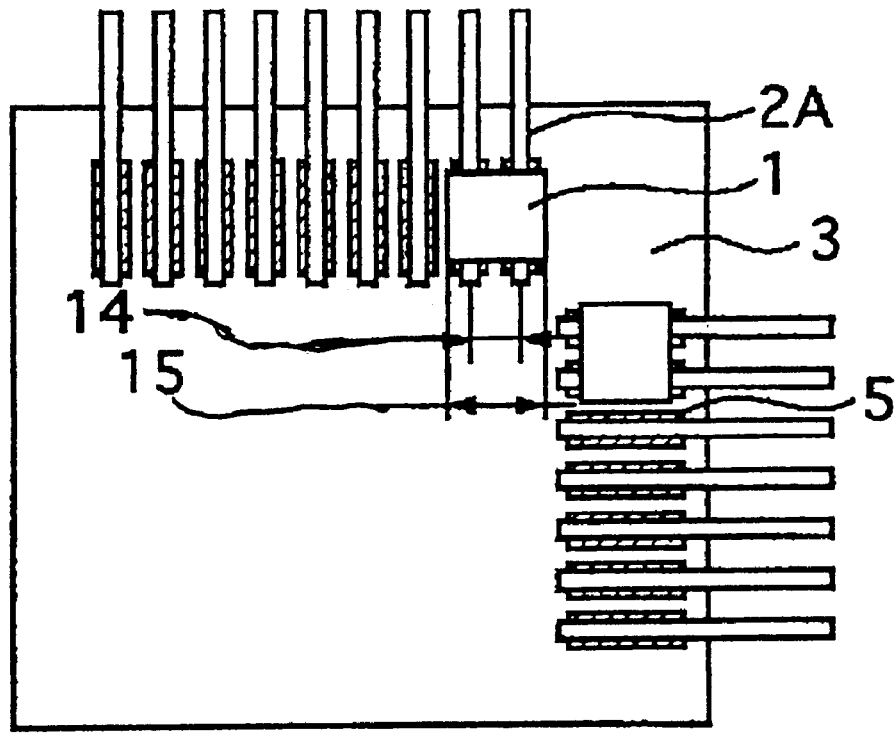
FIG. 11A is a fragmentary plan view illustrative of a third novel bump-free inner lead bonding process for concurrently bonding two inner leads onto two electrode pads of a semiconductor chip by use of a single novel bonding tool in a third embodiment in accordance with the present invention.
Figure 11B:
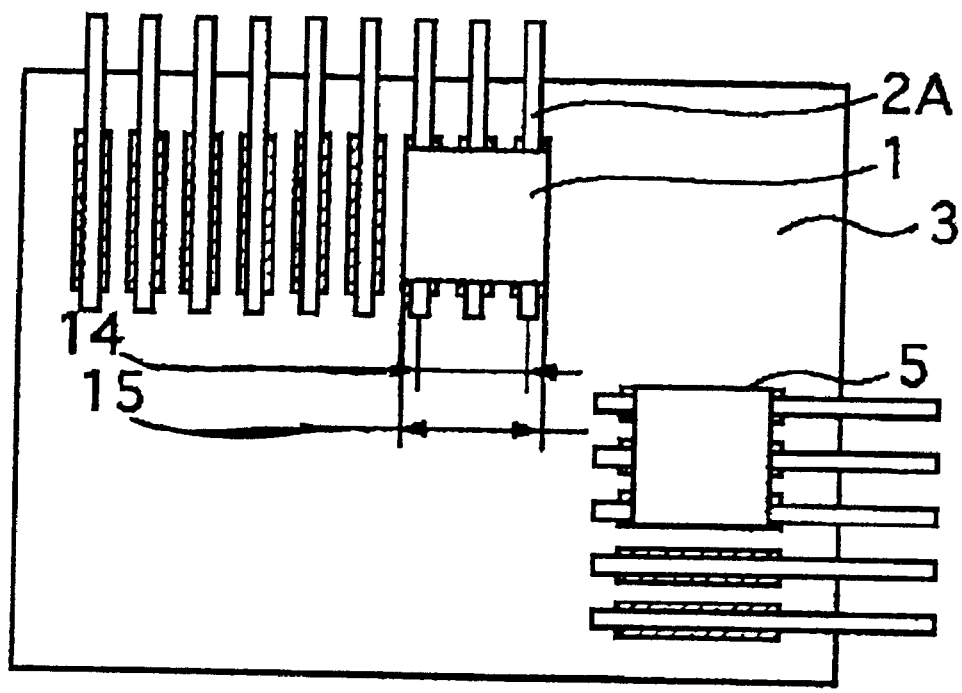
FIG. 11B is a fragmentary plan view illustrative of a third novel bump-free inner lead bonding process for concurrently bonding three inner leads onto three electrode pads of a semiconductor chip by use of a single novel bonding tool in a third embodiment in accordance with the present invention.

With reference to FIGS. 10, 11A and 11B, a pad opening length along the longitudinal direction of the inner lead 2A is not shorter than the sum of a bonding pitch 14 and the pad opening size, namely a pad both ends distance 15. The bonding tool head size is also larger than the sum of a bonding pitch 14 and the pad opening size, namely a pad both ends distance 15. If the pad size is sufficiently large, then it is possible that the bonding tool head size is not shorter than the sum of the bonding pitch 14 and the total width of the inner leads to be concurrently bonded. The bonding tool head is square to have a large size.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A bonding tool that bonds an inner lead to an electrode pad that is exposed through an opening in a passivation film on a semiconductor chip, said bonding tool comprising a head with a rectangular surface that presses said inner lead onto said electrode pad, said rectangular surface having a long side that is perpendicular to a longitudinal direction of said inner lead and longer than a lateral width of said inner lead and a short side that is shorter than said long side and narrower than a corresponding width of said opening in said passivation film.

2. A bonding tool that concurrently bonds two inner leads to two respective electrode pads of a semiconductor chip, said bonding tool comprising a head with a square surface that presses said inner leads onto said electrode pads, said square surface having sides that are no smaller than a sum of a pitch of an adjacent pair of said inner leads and a width of said inner lead.

3. A bonding tool for bonding an inner lead to an electrode pad, said bonding tool comprising a head with a rectangular surface that presses said inner lead onto said electrode pad, where a first side of said rectangular surface is parallel to a longitudinal direction of said inner lead and a second side of said rectangular surface is perpendicular to the longitudinal direction of the said inner lead, and said electrode pad is rectangular with a first side that is parallel to the longitudinal direction of the said inner lead and that is no shorter than a sum of a pitch of an adjacent pair of said inner leads and a width of said inner lead.

4. The bonding tool of claim 3, wherein said second side of said rectangular surface is no shorter than the sum of the pitch of an adjacent pair of said inner leads and the width of said inner lead.

5. The bonding tool of claim 4, wherein said rectangular surface is square.

6. The bonding tool as claimed in claim 1, wherein said head of said bonding tool is corner-chamfered.

7. The bonding tool as claimed in claim 1, wherein said head of said bonding tool is corner-rounded.

* * * * *